United States Patent
Lih et al.

(10) Patent No.: US 9,304,924 B2
(45) Date of Patent: Apr. 5, 2016

(54) CACHE COHERENT HANDSHAKE PROTOCOL FOR IN-ORDER AND OUT-OF-ORDER NETWORKS

(71) Applicant: Futurewei Technologies, Inc., Plano, TX (US)

(72) Inventors: Iulin Lih, San Jose, CA (US); Chenghong He, Shenzhen (CN); Hongbo Shi, Xian (CN); Naxin Zhang, Singapore (SG)

(73) Assignee: Futurewei Technologies, Inc., Plano, TX (US)

( * ) Notice: Subject to any disclaimer, the term of this patent is extended or adjusted under 35 U.S.C. 154(b) by 217 days.

(21) Appl. No.: 13/958,184

(22) Filed: Aug. 2, 2013

(65) Prior Publication Data
US 2014/0052905 A1 Feb. 20, 2014

Related U.S. Application Data (60) Provisional application No. 61/684,324, filed on Aug. 17, 2012.

(51) Int. Cl.
| | | |
|---|---|---|
| G06F 12/00 | (2006.01) | |
| G06F 12/08 | (2006.01) | |
| G06F 13/16 | (2006.01) | |
| G11C 7/10 | (2006.01) | |
| G06F 13/00 | (2006.01) | |
| G06F 13/28 | (2006.01) | |

(52) U.S. Cl.
CPC ........ *G06F 12/0831* (2013.01); *G06F 13/1663* (2013.01); *G11C 7/1072* (2013.01); *G06F 12/0811* (2013.01); *G06F 12/0828* (2013.01)

(58) Field of Classification Search
CPC ............ G06F 12/0828; G06F 12/0831; G06F 13/1663; G06F 12/0811; G11C 7/1072
USPC ........................................................ 711/105
See application file for complete search history.

(56) References Cited

U.S. PATENT DOCUMENTS 6,487,621 B1 * 11/2002 MacLaren ..................... 710/240
6,751,710 B2 * 6/2004 Gharachorloo et al. ...... 711/141
(Continued)

FOREIGN PATENT DOCUMENTS

| CN | 101510191 A | 8/2009 |
|---|---|---|
| CN | 101542441 A | 9/2009 |
| CN | 102132262 A | 7/2011 |

OTHER PUBLICATIONS

Foreign Communication From a Counterpart Application, PCT Application No. PCT/CN2013/081756, International Search Report dated Nov. 28, 2013, 7 pages.
Foreign Communication From a Counterpart Application, PCT Application No. PCT/CN2013/081756, Written Opinion dated Nov. 28, 2013, 4 pages.

*Primary Examiner* — Mark Giardino, Jr.
(74) *Attorney, Agent, or Firm* — Conley Rose, P.C.; Grant Rodolph; Brandt D. Howell (57) ABSTRACT

Disclosed herein is a processing network element (NE) comprising at least one receiver configured to receive a plurality of memory request messages from a plurality of memory nodes, wherein each memory request designates a source node, a destination node, and a memory location, and a plurality of response messages to the memory requests from the plurality of memory nodes, wherein each memory request designates a source node, a destination node, and a memory location, at least one transmitter configured to transmit the memory requests and memory responses to the plurality of memory nodes, and a controller coupled to the receiver and the transmitter and configured to enforce ordering such that memory requests and memory responses designating the same memory location and the same source node/destination node pair are transmitted by the transmitter in the same order received by the receiver.

15 Claims, 6 Drawing Sheets

(56) References Cited

U.S. PATENT DOCUMENTS

| | | | |
|---|---|---|---|
| 6,829,665 B2 * | 12/2004 | Jones et al. | 710/107 |
| 7,308,538 B2 * | 12/2007 | Shen | 711/141 |
| 7,340,565 B2 * | 3/2008 | Steely et al. | 711/130 |
| 7,721,050 B2 | 5/2010 | Hum et al. | |
| 8,255,636 B2 | 8/2012 | Batson et al. | |
| 2006/0123206 A1 * | 6/2006 | Barrett et al. | 711/158 |
| 2008/0140971 A1 | 6/2008 | Dankel et al. | |
| 2009/0327616 A1 | 12/2009 | Conway et al. | |

* cited by examiner

CACHE COHERENT HANDSHAKE PROTOCOL FOR IN-ORDER AND OUT-OF-ORDER NETWORKS

CROSS-REFERENCE TO RELATED APPLICATIONS

The present application claims priority to U.S. Provisional Patent Application 61/684,324, filed Aug. 17, 2012 by Iulin Lih, et. al., and entitled "Cache Coherent Handshake Protocol for In-Order and Out-of-Order Networks," which is incorporated herein by reference as if reproduced in its entirety.

STATEMENT REGARDING FEDERALLY SPONSORED RESEARCH OR DEVELOPMENT

Not applicable.

REFERENCE TO A MICROFICHE APPENDIX

Not applicable.

BACKGROUND

Modern computer systems may rely on multiple interconnected processors to process data. Each processor and/or processor cluster may comprise one or more cache memory locations for storing processing instructions. A given instruction or instruction operand may be copied and located in multiple caches to allow for distributed use between processors. It may be advantageous for a processor and/or processor cluster to maintain structures and/or protocols to locate, execute, and/or modify such instructions.

SUMMARY

In one embodiment, the disclosure includes a processing network element (NE) comprising at least one receiver configured to receive a plurality of memory request messages from a plurality of memory nodes, wherein each memory request designates a source node, a destination node, and a memory location, and a plurality of response messages to the memory requests from the plurality of memory nodes, wherein each memory request designates a source node, a destination node, and a memory location, at least one transmitter configured to transmit the memory requests and memory responses to the plurality of memory nodes, and a controller coupled to the receiver and the transmitter and configured to enforce ordering such that memory requests and memory responses designating the same memory location and the same source node/destination node pair are transmitted by the transmitter in the same order received by the receiver.

In another embodiment, the disclosure includes a method implemented in a processing network comprising receiving a plurality of memory request messages, wherein each memory request designates a source node, a destination node, and a memory location, receiving a plurality of response messages to the memory requests, wherein each memory request designates a source node, a destination node, and a memory location, and forwarding the memory request messages and the memory response messages such that memory requests and memory responses designating the same memory location and the same source node/destination node pair are forwarded in the order received.

In another embodiment, the disclosure includes a home agent position in a processing network and comprising a memory configured to store data in a memory block, and a controller configured to receive a first cache coherent request message for the data from a requesting node, in response the first request messages, transmit a first snoop message to a cache agent owner of the data, receive a first snoop response to the first snoop request, and based on the results of the first snoop response, transmit a first message response to the requesting node, wherein the controller is further configured to receive and process a second cache coherent request message for the data, received after the first cache coherent request message, without awaiting an acknowledgement message from the requesting node.

These and other features will be more clearly understood from the following detailed description taken in conjunction with the accompanying drawings and claims.

BRIEF DESCRIPTION OF THE DRAWINGS

For a more complete understanding of this disclosure, reference is now made to the following brief description, taken in connection with the accompanying drawings and detailed description, wherein like reference numerals represent like parts.

DETAILED DESCRIPTION

It should be understood at the outset that, although an illustrative implementation of one or more embodiments are provided below, the disclosed systems and/or methods may be implemented using any number of techniques, whether currently known or in existence. The disclosure should in no way be limited to the illustrative implementations, drawings, and techniques illustrated below, including the exemplary designs and implementations illustrated and described herein, but may be modified within the scope of the appended claims along with their full scope of equivalents.

Processors may make changes to memory as part of performing the processing function. Processors may make such changes by updating local copies of data stored in a cache memory. Such changes may then be propagated toward main memory. Such a system may result in errors in multiprocessor systems as a first processor may make changes to a first local copy of data and a second processor may substantially contemporaneously make changes to a second local copy of the same data without knowledge of the changes made by the first processor. Such errors may be alleviated by a cache coherence scheme, which may be any protocol implemented to update local copies of data (e.g. stored in caches and/or Random Access Memory (RAM)) to support substantially system wide data consistency. Cache coherence schemes may employ handshaking protocols and similar mechanisms to update shared data and/or local copies of data based on changes made to other local copies of the same data. Such handshaking protocols may maintain the integrity of the cache coherency scheme by delaying subsequent cache functions and/or processor processes until data updates related to previous cache functions can be confirmed. For example, cache handshaking protocols may require that a correspondent node (e.g. a cache) to send an acknowledgement of a data update before other caches and/or processors may employ the updated data in order to prevent data mismatches. To support increased processing speed in such processing networks, it may be advantageous to reduce and/or eliminate delays where possible while maintaining the integrity of the cache coherency scheme.

Disclosed herein is a cache coherent handshaking protocol that may reduce cache, RAM, and/or processor delays by dispensing with an acknowledgement pass requirement. In order to maintain coherence without an acknowledgement, the associated network may enforce a message ordering rule to prevent data mismatches. NEs in the network may check incoming messages for a source node address, a destination node address, and a memory address. Messages with the same source node/destination node pair and related to the same memory address may be forwarded in the same order received. Such a rule may be enforced by requiring all messages with the same source/destination pair and memory address (e.g. cache line and/or RAM address line) to be forwarded along the same physical channel through the network. Such messages may still be forwarded via different virtual channels (e.g. created by time division multiplexing). Such a rule may also be enforced by cross-posting. Cross-posting may comprise placing a copy of the first message received, referred to herein as a dummy message, in queue before the second message is received. This first copy of the first message that is cleared for transmission (e.g. the dummy message or the first message) may be transmitted, while the second copy of the first message may be dropped. The message ordering rule may be dynamically discontinued and the acknowledgement pass dynamically reintroduced in situations where such would increase the overall speed of the network.

Figure 1:
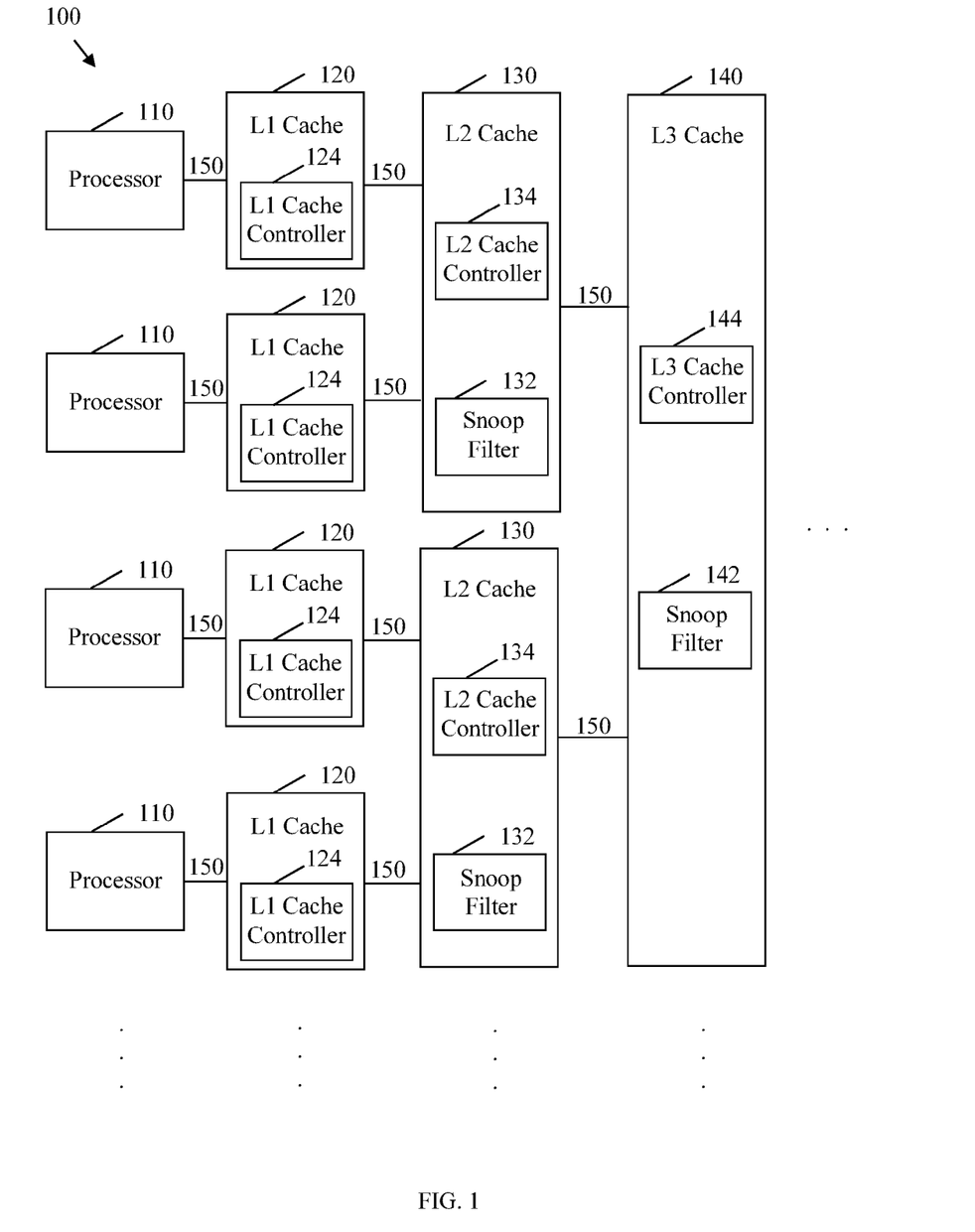
FIG. 1 is a schematic diagram of an embodiment of a multiprocessor network architecture.
Figure 2:
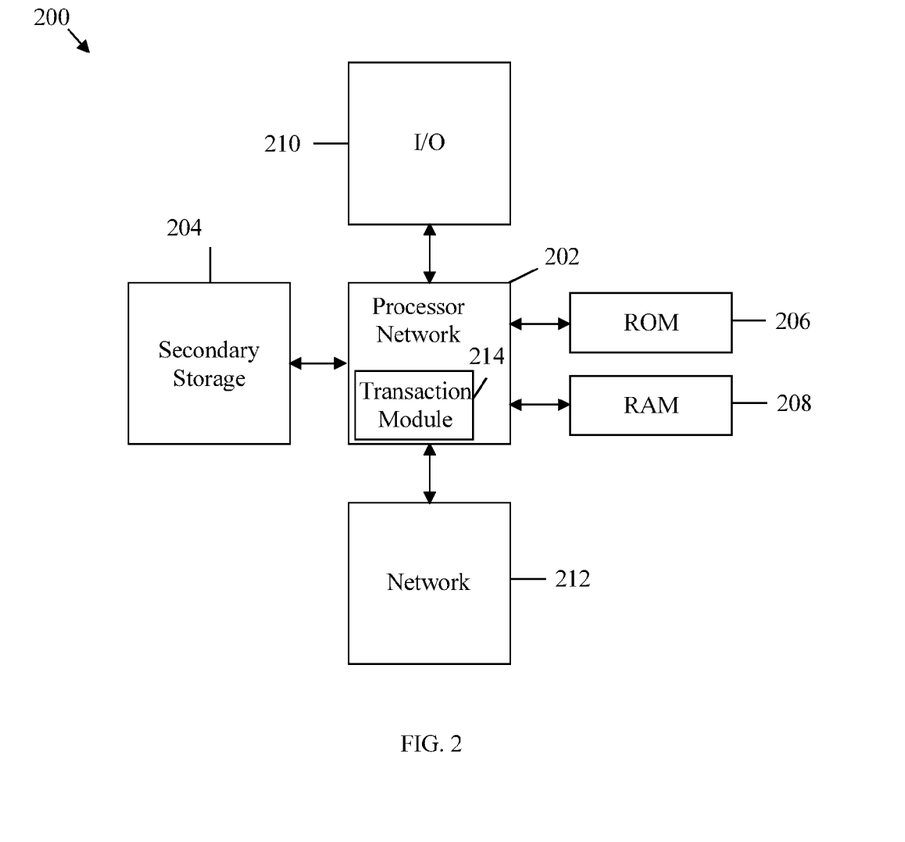
FIG. 2 is a schematic diagram of an embodiment of a general-purpose computer system.

FIG. 1 is a schematic diagram of an embodiment of a multiprocessor network architecture. The network 100 may comprise a plurality of processors 110 which may be coupled to level 1 (L1) caches 120, level 2 (L2) caches 130, and level 3 (L3) caches 140, via a routing network 150. L1 caches 120 may each comprise a L1 cache controller 124. L2 caches 130 may each comprise a L2 cache controller 134 coupled to a snoop filter 132. L3 caches 140 may comprise a L3 cache controller 144 coupled to a snoop filter 142. Additional caches, cache layers, and/or processors may be added as needed for a particular embodiment. Higher order caches may store data and respond to requests from lower order caches and/or processors. Each entity may act as a cache agent and/or a home agent. A home agent may be a higher order entity that responds to requests. A cache agent may be a lower order entity that makes requests. Each cache 120, 130, 140, each processor 110, and any associated RAM, as shown in FIG. 2 herein below, may be considered nodes of network 100 and portions of routing network 150 may be considered network 100 links. While network 100 is depicted with one L1 cache 120 per processor 110 and two lower order caches for each higher order cache for the purposes of simplicity, many different combinations and/or permutations of cache to cache and processor to cache connections may be employed.

The processors 110 may be referred to as central processing units or CPUs. The processors 110 may be entities within a network 100 that process instructions of a program by performing arithmetical, logical, and/or input/output operations of the network 100. The processors 110 may each comprise an arithmetic logic unit that may perform arithmetic, logical, and/or other operations and a control unit that may request instructions from memory (e.g. caches 120, 130, and/or 140). The control unit may also decode and execute such instructions in conjunction with the arithmetic logic unit.

The L1 caches 120, L2 caches 130, and L3 caches 140 may be components that transparently store data and provide rapid responses to requests. For reasons of cost and data use efficiency, the caches 120, 130, and 140 may comprise relatively small memory and may be located in close proximity to the CPUs 110. Lower order caches, such as L1 caches 120, may comprise less storage space and may be located closer to the CPUs 110, while higher order caches, such as L3 caches 140, may comprise more space and may be located farther away from the CPUs 110. The position and size of the caches 120, 130, and/or 140 may be selected to balance design goals of storage and low latency. Caches 120, 130, and/or 140 may each store local copies of data maintained in main memory (e.g. RAM).

The L1 cache controllers 124, L2 cache controllers 134, and L3 cache controllers 144 may be programs and/or components configured to manage cache memory. For example, cache controllers 124, 134, and/or 144 may ensure that data in the caches is valid or marked as invalid. Cache controllers 124, 134, and/or 144 may also service cache misses and update requests such as cache line state updates and data updates as well as transmit associated snoop requests and snoop responses. A snoop request may be a request to determine the status of a specified memory location that may be cached by another network node, and a snoop response may be a response to a snoop request, which may be transmitted by the snooped node (e.g. the node receiving the snoop request). The cache controller may also handle interrupt requests and generate data replies. Cache controllers 124, 134, and/or 144 may also perform other functions as needed to maintain cache coherence between the caches 120, 130, and/or 140 and/or provide associated logical functions.

The L2 snoop filter 132 and L3 snoop filter 142 may be components and/or programs configured to maintain data regarding cache line usage at a specified time. For example, a snoop filter 132 and/or 142 may comprise a table or tables and may indicate cache line addresses, cache line ownership (e.g. data indicating that caches 120, 130, and/or 140 may be storing and/or modifying a cache line at a specified time), and/or other attributes related to the cache line. Snoop filter 132 and/or 142 may further comprise index values, which may be employed to manage the table(s). Snoop filter 132 and/or 142 may be employed to maintain coherence between caches 120, 130, and/or 140. For example, a plurality of processors 110 may perform operations on data in the same memory location substantially simultaneously. Such data may be owned (e.g. cached and/or stored) in a plurality of caches 120, 130, and/or 140 substantially simultaneously. The snoop filter 132 and/or 142 may indicate all cache owners so that each owner may be informed (e.g. by a cache controller 124, 134, and/or 144) when data stored in their cache is modified by another processor and/or cache. Informing each cache owner of such changes may allow each cache to maintain an accurate, updated local copy of main memory data, which may allow cache coherence to occur. A snoop filter 132 and/or 142 may also be referred to as a directory. In some embodiments, snoop filters 132 and/or 142 may be omitted, in which case snoop messages may be broadcast to all caches and/or all lower order caches. Omitting snoop filter 132 and/or 142 may increase overall network traffic as snoop requests may be transmitted to nodes that may be uninterested in a particular message. However, omitting snoop filter 132 and/or 142 may increase speed by eliminating the associated table lookup.

Routing network 150 may comprise a plurality of physical channels and/or a plurality of virtual channels that may be employed to transmit messages and/or data between nodes of network 100. Physical channels may comprise conductive material and/or physical components that may electrically couple nodes of network 100 (e.g. processors 110, caches 120, 130, and/or 140, and/or associated RAM). For example, routing network 150 may comprise serial and/or parallel buses. Virtual channels may be logical abstractions of physical channels. For example, a virtual channel may be implemented by employing a buffer and time division multiplexing. Messages may be stored in a buffer and allocated to various virtual channels. Each virtual channel may be multiplexed onto the same physical channel and/or set of physical channels in the time domain such that the virtual channels may traverse substantially the same hardware, but may be afforded different rules such as varying transmission priority, latency, etc.

The network 100 may process data using a cache coherent handshaking protocol. For example, a processor 110 may send a request to an associated L1 cache 120 to read and/or write to a specified memory location. If the requested data is not present in L1 cache 120, the request may result in a cache miss, in which case the L1 cache 120 may request to obtain the memory from an upstream cache (e.g. L2 cache 130, L3 cache 140, etc. and/or RAM). If the requested data is stored in a cache line of L1 cache 120 and if the L1 cache 120 is not the exclusive owner of the cache line (e.g. other local copies of the line may exist across network 100), the L1 cache 120, acting as a cache agent, may request permission to read and/or write to the cache line from L2 cache 130, which may act as a home agent to L1 cache 120. The home agent may be aware of other interested nodes (e.g. caches that comprise local copies of the requested data) via the snoop filter, if present. The home agent may transmit a snoop request to any known owners of the requested data and/or broadcast a snoop request to all potential owners of the requested data to determine whether any owner has made changes to a local copy of the requested data. The snooped nodes (e.g. the caches 120, 130, and/or 140 and/or RAM) may return a snoop response. Depending on the type of snoop request, such snooped node may recognize that their cached data is about to change (e.g. by the requesting processor 110) and mark their own data as dirty, which may indicate that data is invalid and/or potentially invalid and should be treated in a manner similar to a cache miss. Upon receiving the snoop response, the home agent may transmit the data and/or permissions appropriate to the request downstream toward the processor 110 via the cache agent (e.g. L1 cache 120). The cache agent may acknowledge receipt of the message response. As such, a common request message may generally be implemented in a five pass cache coherent handshaking protocol: (1) memory request message, (2) snoop message, (3) snoop response message, (4) memory response message, and (5) acknowledgement message. It should be noted that such handshakes may occur over substantially the entire network 100 (e.g. by forwarding the request message to progressively higher order caches for downstream snooping where appropriate). Many such handshakes may occur in rapid succession. Many requests may be associated with substantially the same memory location. As such, the acknowledgment pass may allow the home agent to delay subsequent transactions until a previous transaction is complete. The acknowledgment pass may prevent situations where a pass of a subsequent transaction is positioned in front of a similar pass of a previous transaction (e.g. due to priority or similar buffer issues and/or message loss), which may result in a processor 110 employing invalid data and may result in compromising the cache coherency scheme.

As noted above, it may be advantageous to increase network 100 speed by removing the acknowledgment pass without compromising cache coherency. Removal of the acknowledgment pass may be accomplished by maintaining order in messages that relate to the same source node and destination node pair and the same memory location. For example, a transaction may be related to nodes N1, N2, and memory location M1. A message relating to a transaction may be denoted in the form (S, D, M), where S is the message's source node, D is the messages destination node, and M is the memory location to which the message relates. As such, a first message (N1, N2, M1) and a second message (N2, N1, M1) may relate to the same source/destination pair and the same memory location. To remove the acknowledgment pass, NEs in network 100 (e.g. processor 110, caches 120, 130, 140, associated RAM, and NEs in routing network 150) may enforce an ordering rule by ordering messages such that memory requests and memory responses designating the same memory location and the same source node/destination node pair may be transmitted in the same order received. Such ordering at the NE level may prevent a pass of a subsequent transaction from becoming positioned in front of a pass of a previous transaction, and may accordingly preserve cache coherency. Messages not related to the same source/destination pair and/or not related to the same memory location may be forwarded without regard to the ordering rule discussed herein. It should be noted that, as used herein, the same memory location may refer to any identified memory sections with overlapping memory ranges.

The message ordering rule may be enforced at the link and/or node level by channel enforcement and/or by cross-posting. In channel enforcement, all messages associated with the same source/destination pair and memory location may be positioned in the same physical channel. For example, a request message (e.g. a memory request and/or snoop request) and a response message (e.g. a memory response and/or a snoop response) associated with the same source/destination pair and memory location may be positioned on the same physical channel and not positioned on a dedicated request channel and a dedicated response channel, respectively. Regardless of the physical channel ordering, such messages may be positioned in different virtual channels to support other functionality that may be specific to each message type. In cross-posting, messages may be ordered by positioning a copy (or copies) of a first message in a first channel in front of a second message (or messages) in a second channel (or channels), such that the copy of the first message must be transmitted prior to the second message. The node and/or link performing the cross-posting may then transmit either the first message or the first message copy, whichever reaches the front of the associated queue and/or is approved for transmission first, and drop the remaining first message copy or first message, respectively. NEs of network 100 may employ channel enforcement, cross-posting, or combinations thereof, to order messages with the same source/destination pair and related to the same memory location (or overlapping memory ranges). By enforcing the message ordering rule, the acknowledge pass may be eliminated, which may result in a network 100 that requires less power, experiences higher throughput, and is more scalable to operate with ever larger groups of caches 120, 130, 140, and/or other higher order caches.

The devices, systems, and methods described above may be implemented on any general-purpose network component, such as a computer or network component with sufficient processing power, memory resources, and network throughput capability to handle the necessary workload placed upon it. FIG. 2 illustrates a typical, general-purpose network component 200 suitable for implementing one or more embodiments of the components and/or methods disclosed herein. The network component 200 includes a processing network 202 (which may be referred to as a central processor unit cluster or CPU cluster) that is in communication with memory devices including secondary storage 204, read only memory (ROM) 206, RAM 208, input/output (I/O) devices 210, a transaction module 214, and network connectivity devices 212. The processing network 202 may be implemented as one or more processors such as processors 110, and/or may be part of one or more application specific integrated circuits (ASICs) and/or digital signal processors (DSPs). Transaction module 214 may comprise a plurality of caches, such as caches 120, 130, and/or 140, and/or routing network 150 and may store local copies of main memory data (e.g. from storage 204, memory 206, and/or memory 208) for fast access by the processing network 202, and may be configured to maintain cache coherence.

The secondary storage 204 is typically comprised of one or more disk drives or tape drives and is used for non-volatile storage of data and as an over-flow data storage device if RAM 208 is not large enough to hold all working data. Secondary storage 204 may be used to store programs that are loaded into RAM 208 when such programs are selected for execution. The ROM 206 is used to store instructions and perhaps data that are read during program execution. ROM 206 is a non-volatile memory device that typically has a small memory capacity relative to the larger memory capacity of secondary storage 204. The RAM 208 is used to store volatile data and perhaps to store instructions. Access to both ROM 206 and RAM 208 is typically faster than to secondary storage 204. It should be noted that RAM 208 may act as a home agent to caches in the transaction module and may be considered a part of network 100 in some embodiments. Network 100, and methods 300, 400, 500, and 600 may be implemented in processing network 202, RAM 208, ROM 206, the transaction module 214, and/or secondary storage 204.

It is understood that by programming and/or loading executable instructions onto the network component 200, at least one of the processor cluster 202, transaction module 214, ROM 206, RAM 208, secondary storage 204, network 212, and/or I/O 210 are changed, transforming the network component 200 in part into a particular machine or apparatus, e.g., a multi-core forwarding architecture, having the novel functionality taught by the present disclosure. It is fundamental to the electrical engineering and software engineering arts that functionality that can be implemented by loading executable software into a computer can be converted to a hardware implementation by well-known design rules. Decisions between implementing a concept in software versus hardware typically hinge on considerations of stability of the design and numbers of units to be produced rather than any issues involved in translating from the software domain to the hardware domain. Generally, a design that is still subject to frequent change may be preferred to be implemented in software, because re-spinning a hardware implementation is more expensive than re-spinning a software design. Generally, a design that is stable that will be produced in large volume may be preferred to be implemented in hardware, for example in an ASIC, because for large production runs the hardware implementation may be less expensive than the software implementation. Often a design may be developed and tested in a software form and later transformed, by well-known design rules, to an equivalent hardware implementation in an application specific integrated circuit that hardwires the instructions of the software. In the same manner as a machine controlled by a new ASIC is a particular machine or apparatus, likewise a computer that has been programmed and/or loaded with executable instructions may be viewed as a particular machine or apparatus.

Figure 3:
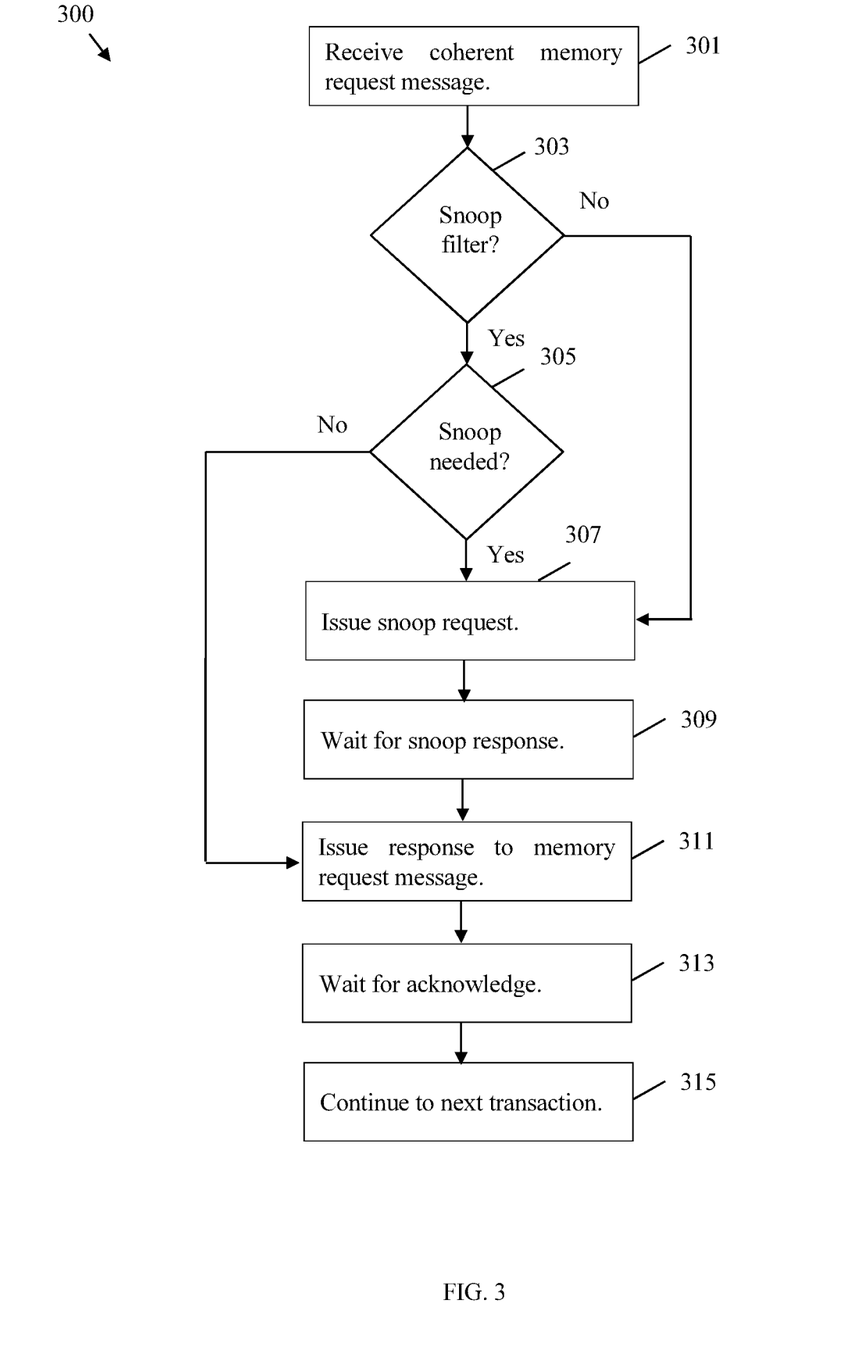
FIG. 3 is a flow chart of an embodiment of a method of performing a cache coherent transaction.

FIG. 3 is a flow chart of an embodiment of a method 300 of performing a cache coherent transaction, for example by a node acting as a home agent in network 100, such as cache 120, 130, 140, and/or RAM 208. At step 301, a cache coherent memory request message may be received, for example by a controller of a node acting as a home agent. At step 303, method 300 may determine whether a snoop filter, such as snoop filter 132 and/or 142, is present (e.g. on the home agent). The method 300 may proceed to step 305 if a snoop filter is present and step 307 if no snoop filter is present. At step 305, the method 300 may determine whether a snoop is needed. For example, a snoop may not be needed if the home agent does not comprise a local copy of the requested memory location, which may be referred to as a cache miss. As another example, a snoop may not be needed if the snoop filter indicates that no other caches own (e.g. have local copies of) the requested memory location. As another example, a snoop may be needed if requested memory location (e.g. cache line) is owned by one or more caches. The method 300 may proceed to step 311 if no snoop is needed and step 307 if a snoop is needed. At step 307, method 300 may have determined that a snoop is needed, and may transmit a snoop to all owners and/or potential owners. For example, the snoop may be transmitted to each owner indicated in the snoop filter and/or the snoop may be broadcast to all potential owners, e.g. if no snoop filter is present. At step 309, the method 300 may wait for a snoop response from the memory location owners and/or potential owners. Once the snoop response(s) are received, the method 300 may proceed to step 311 and may issue a response to the memory request of step 301. The memory response may be based on the snoop response(s) received at step 309 and/or based on the memory of the home agent if no snoop was needed at step 305. At step 313, method 300 may wait on an acknowledgement message from the node that transmitted the memory request of step 301. Upon receiving the acknowledgement message, the method 300 may proceed to step 315 and may continue with the next transaction. It should be noted that a home agent implementing method 300 may process other transactions while waiting at steps 309 and 315, but may not process any transactions related to the memory locations being requested at step 301 and/or snooped at step 307.

Figure 4:
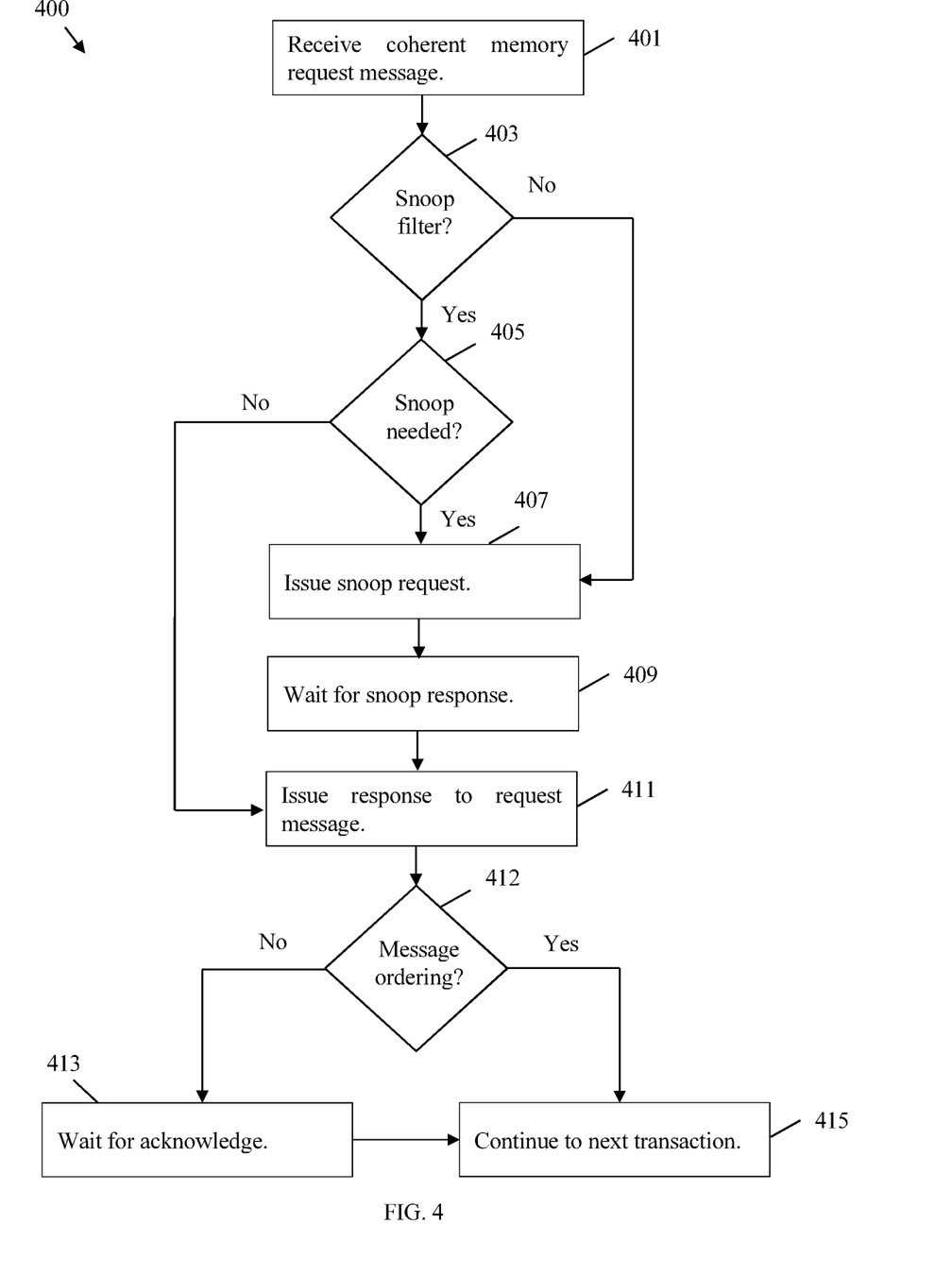
FIG. 4 is a flow chart of another embodiment of a method of performing a cache coherent transaction.

FIG. 4 is a flow chart of another embodiment of a method 400 of performing a cache coherent transaction, for example by a node acting as a home agent in network 100, such as cache 120, 130, 140, and/or RAM 208. Method 400 may comprise steps 401, 403, 405, 407, 409, and 415, which may be substantially similar to steps 301, 303, 305, 307, 309, and 315. In contrast to method 300, after transmitting the memory response message at step 411, the method 400 may proceed to step 412 and may determine whether the network, e.g. network 100, is configured to enforce the ordering rule such that memory requests and memory responses designating the same memory location and the same source node/destination node pair may be transmitted in the same order received. If the network is not configured to enforce the ordering rule of step 412, the method may proceed to step 413, which may be substantially similar to step 313. If the network is configured to enforce the ordering rule of step 412, the method 400 may proceed to step 415 and proceed with the next transaction without waiting for the acknowledgement of step 413. It should be noted that a network may be configured to dynamically enforce and/or desist from enforcing the ordering rule of step 412, on an as needed basis to optimize overall network speed, power consumption, etc. It should be noted that in some embodiments, method 400 may proceed to the next transaction at step 415 in parallel with completing steps 409 and 411 when the ordering rule of step 412 is enforced. In such cases, step 407 may proceed to steps 409 and 412 at substantially the same time, with step 412 resulting in moving to a new transaction at step 415 or returning to complete steps 409, 411, and 413 prior to moving to the next transaction, respectively.

Figure 5:
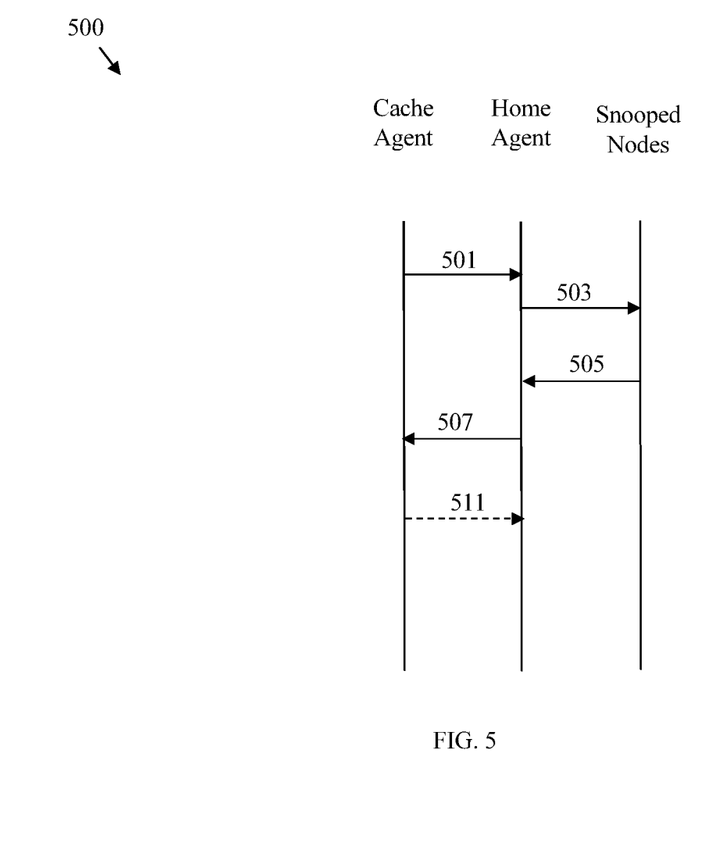
FIG. 5 is a protocol diagram of another embodiment of a method of performing a cache coherent transaction.

FIG. 5 is a protocol diagram of another embodiment of a method 500 of performing a cache coherent transaction. Method 500 may be performed by a home agent (e.g. cache 120, 130, and/or 140, and/or RAM 208) implementing method 400 in a network such as network 100. At step 501, a cache agent (e.g. a transaction source node) may transmit a memory request to a home agent (e.g. a transaction destination node). For example, the memory request may comprise a coherent read request without peer to peer forwarding, a coherent write through request, a coherent write permit request without peer to peer forwarding, etc. At step 503, the home agent may transmit a snoop request to appropriate snooped node(s), which may be owners of the memory location(s) implicated by the request of step 501. The snoop request of step 503 may be a snoop and invalidate request, for example in the case of a write through request, that may invalidate the data stored at the snooped nodes, and/or a snoop without forwarding request, for example in the case of a read or a write permit request. At step 505, the snooped node(s) may transmit a response to the snoop request of step 503. The snoop response of step 505 may comprise an updated copy of the snooped data and/or an indication that no changes have been made to the local copy since the snooped node(s) last communicated with the home agent. At step 507, the home agent may transmit a memory response to the cache agent. The memory response of step 507 may be a coherent read response message, a coherent write though response, a coherent write permit response, etc. Optionally, if the ordering rule disclosed herein is not employed, the cache agent may transmit an acknowledgement at step 511, which may be indicated by a dashed line in FIG. 5 to indicate that such step is optional. However, if the ordering rule disclosed herein is employed by the relevant network, step 511 may be omitted, which may reduce wait time at the home agent and network traffic between the cache agent and the home agent.

Figure 6:
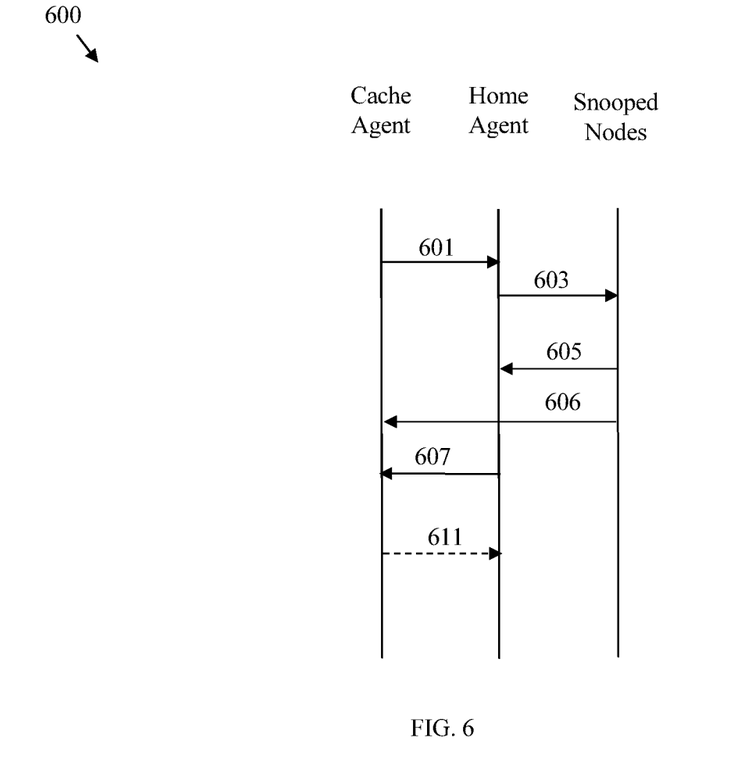
FIG. 6 is a protocol diagram of another embodiment of a method of performing a cache coherent transaction.

FIG. 6 is a protocol diagram of another embodiment of a method 600 of performing a cache coherent transaction. Method 600 may be performed by a home agent (e.g. cache 120, 130, and/or 140, and/or RAM 208) implementing method 400 in a network such as network 100. Method 600 may employ steps 601, 603, 605, 607, and optional step 611, which may be substantially similar to steps 501, 503, 505, 507, and optional step 511. In contrast to method 500, method 600 may be employed for transactions with peer forwarding, such as a coherent read transaction with peer to peer forwarding, a coherent write permit transaction with peer forwarding, etc. Method 600 may further comprise step 606, in which the snooped node may transmit any requested data directly to the cache agent (e.g. peer to peer forwarding). As such, the memory response of step 606, (e.g. a coherent read complete message, a coherent write permit response packet, etc.) may not comprise the snooped data. As with method 500, method 600 may omit the acknowledgment message pass of step 611 if the message ordering rule discussed herein is enforced by the network.

Figure 7:
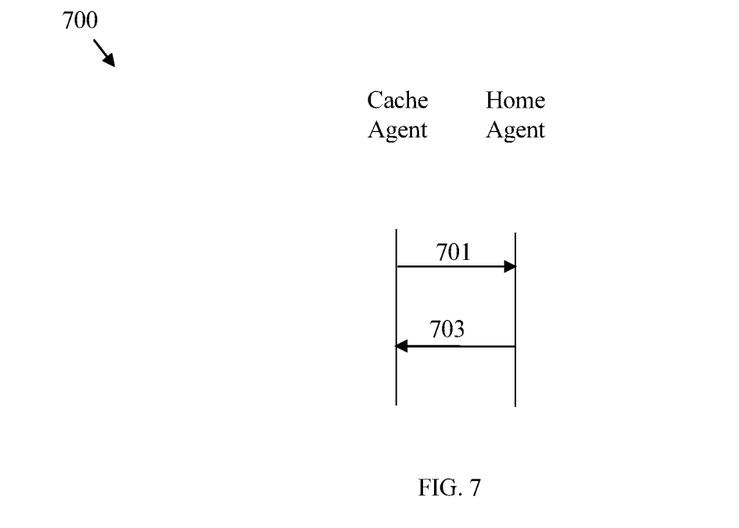
FIG. 7 is a protocol diagram of another embodiment of a method of performing a cache coherent transaction.

FIG. 7 is a protocol diagram of another embodiment of a method 700 of performing a cache coherent transaction. Method 700 may be performed by a home agent (e.g. cache 120, 130, and/or 140, and/or RAM 208) implementing method 400 in a network such as network 100. At step 701, a cache agent may transmit an unsolicited or a solicited snoop response to a home agent. For example, the snoop response of step 701 may be a write back message, which may allow the cache agent to update the home agent regarding any changes made to an associated memory location. In another embodiment, the snoop response of step 701 may be an eviction message to indicate that the cache agent is deleting and/or giving up ownership of an associated memory location. At step 703, the home agent may respond with a memory response, which may comprise a write back response message and/or an evict response message, respectively. As with methods 500 and/or 600, an acknowledgment may not be employed in method 700.

At least one embodiment is disclosed and variations, combinations, and/or modifications of the embodiment(s) and/or features of the embodiment(s) made by a person having ordinary skill in the art are within the scope of the disclosure. Alternative embodiments that result from combining, integrating, and/or omitting features of the embodiment(s) are also within the scope of the disclosure. Where numerical ranges or limitations are expressly stated, such express ranges or limitations should be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). For example, whenever a numerical range with a lower limit, Rl, and an upper limit, Ru, is disclosed, any number falling within the range is specifically disclosed. In particular, the following numbers within the range are specifically disclosed: $R=R_l+k*(R_u-R_l)$, wherein k is a variable ranging from 1 percent to 100 percent with a 1 percent increment, i.e., k is 1 percent, 2 percent, 3 percent, 4 percent, 7 percent, . . . , 70 percent, 71 percent, 72 percent, . . . , 97 percent, 96 percent, 97 percent, 98 percent, 99 percent, or 100 percent. Moreover, any numerical range defined by two R numbers as defined in the above is also specifically disclosed. The use of the term "about" means ±10% of the subsequent number, unless otherwise stated. Use of the term "optionally" with respect to any element of a claim means that the element is required, or alternatively, the element is not required, both alternatives being within the scope of the claim. Use of broader terms such as comprises, includes, and having should be understood to provide support for narrower terms such as consisting of, consisting essentially of, and comprised substantially of. Accordingly, the scope of protection is not limited by the description set out above but is defined by the claims that follow, that scope including all equivalents of the subject matter of the claims. Each and every claim is incorporated as further disclosure into the specification and the claims are embodiment(s) of the present disclosure. The discussion of a reference in the disclosure is not an admission that it is prior art, especially any reference that has a publication date after the priority date of this application. The disclosure of all patents, patent applications, and publications cited in the disclosure are hereby incorporated by reference, to the extent that they provide exemplary, procedural, or other details supplementary to the disclosure.

While several embodiments have been provided in the present disclosure, it may be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

In addition, techniques, systems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and may be made without departing from the spirit and scope disclosed herein.

What is claimed is:

1. A hardware processing element in a processor network, the hardware processing element comprising:
   at least one receiver configured to receive:
   a plurality of memory request messages from a plurality of memory nodes,
      wherein each memory request designates a source node, a destination node, and a memory location; and
   a plurality of response messages to the memory requests from the plurality of memory nodes, wherein each memory request designates a source node, a destination node, and a memory location;
   at least one transmitter configured to transmit the memory requests and memory responses to the plurality of memory nodes; and
   a controller coupled to the receiver and the transmitter and configured to enforce ordering such that memory requests and memory responses designating the same memory location and the same source node/destination node pair are transmitted by the transmitter in the same order received by the receiver,
   wherein the hardware processing element is coupled to the memory nodes via a plurality of channels, wherein an earlier received ordered memory message is positioned in a first of the channels,
   wherein a later received ordered memory message is positioned in a second of the channels, and
   wherein order is enforced by cross-posting a copy of the earlier received message in the second channel in front of the later received message.

2. The hardware processing element of claim 1, wherein the receiver does not receive acknowledgement messages associated with the ordered memory responses.

3. The hardware processing element of claim 1, wherein the memory requests are snoop requests transmitted toward cache nodes, and wherein the memory responses are snoop responses received from cache nodes.

4. The hardware processing element of claim 1, wherein the hardware processing element is a Random Access Memory (RAM) component electrically coupled to a plurality of processor caches.

5. The hardware processing element of claim 1, wherein the hardware processing element is a processor cache acting as a home agent.

6. The hardware processing element of claim 1, wherein the hardware processing element is a bus coupling a plurality of memory components via a plurality of physical channels, a plurality of virtual channels, or combinations thereof.

7. The processing element of claim 1, wherein hardware processing element is coupled to the memory nodes via a plurality of physical channels, and wherein order is enforced by requiring ordered memory requests and memory responses to traverse the same physical channel.

8. A method implemented in a processing network comprising:
   receiving, at a hardware processing element in the processor network, a plurality of memory request messages, wherein each memory request designates a source node, a destination node, and a memory location;
   receiving, at the element, a plurality of response messages to the memory requests, wherein each memory request designates a source node, a destination node, and a memory location; and
   forwarding, by the hardware processing element, the memory request messages and the memory response messages such that memory requests and memory responses designating the same memory location and the same source node/destination node pair are forwarded in the order received,
   wherein the forwarding order is not preserved for messages that do not designate the same source node/destination node pair.

9. The method of claim 8, wherein the forwarding order is not preserved for messages that do not designate the same memory location.

10. The method of claim 8, wherein the method does not comprise receiving an acknowledgement message in response to the ordered response message.

11. The method of claim 8, wherein the method is employed to enforce a multiprocessor cache coherency scheme.

12. The method of claim 8, wherein the forwarding order is maintained by requiring ordered messages to traverse a common physical channel, is maintained by channel cross-posting, or combinations thereof.

13. A home agent position in a processing network comprising:
   a memory configured to store data in a memory block; and
   a controller configured to:
      receive a first cache coherent request message for the data from a requesting node;
      in response to receiving the first request message, transmit a first snoop message to a cache agent owner of the data;
      receive a first snoop response to the first snoop request; and
      based on the results of the first snoop response, transmit a first message response to the requesting node,
   wherein the controller is further configured to receive and process a second cache coherent request message for the data, received after the first cache coherent request message, without awaiting an acknowledgement message from the requesting nod;
   wherein the home agent is coupled to a plurality of cache agent nodes, wherein the memory comprises a plurality of memory blocks, and wherein the home agent is positioned in a network that maintains message order for all messages directed to a common source node/destination node pair and a common memory block,
   wherein the home agent is coupled to the cache agent nodes via a plurality of channels, and
   wherein the controller is further configured to maintain message order by:

cross-posting copies of a message to a plurality of the channels;
transmitting one copy of the message on one of the channels associated with the cross-posting; and
discarding the remaining message copies.

14. The home agent of claim 13, wherein the controller is further configured to transmit a second snoop request related to the data prior to receiving the first snoop response.

15. The home agent of claim 13, wherein the controller does not receive any acknowledgement messages associated with cache coherent transactions.

* * * * *